(12) United States Patent
Strenski et al.

(10) Patent No.: US 8,443,322 B2
(45) Date of Patent: May 14, 2013

(54) USING LAYOUT ENUMERATION TO FACILITATE INTEGRATED CIRCUIT DEVELOPMENT

(75) Inventors: Philip N. Strenski, Yorktown Heights, NY (US); Mark A. Lavin, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 503 days.

(21) Appl. No.: 12/406,996

(22) Filed: Mar. 19, 2009

(65) Prior Publication Data

US 2010/0242000 A1 Sep. 23, 2010

(51) Int. Cl.
*G06F 17/50* (2006.01)
*G06F 9/455* (2006.01)
*G06F 11/22* (2006.01)

(52) U.S. Cl.
USPC ............ 716/119; 716/123; 716/132; 716/136

(58) Field of Classification Search .................. 716/119, 716/123, 132, 136
See application file for complete search history.

(56) References Cited

U.S. PATENT DOCUMENTS

| 7,082,595 | B1 | 7/2006 | Chan et al. | |
| 7,313,769 | B1 | 12/2007 | Lukanc et al. | |
| 2006/0036977 | A1 | 2/2006 | Cohn et al. | |
| 2008/0148194 | A1* | 6/2008 | Chan et al. | 716/2 |
| 2008/0148216 | A1* | 6/2008 | Chan et al. | 716/19 |

* cited by examiner

*Primary Examiner* — Jack Chiang
*Assistant Examiner* — Magid Dimyan
(74) *Attorney, Agent, or Firm* — Cantor Colburn LLP; Dan Schnurmann

(57) ABSTRACT

A method for using layout enumeration to facilitate integrated circuit development includes defining an initial set of design ground rules represented in a notation compatible with a coarse placement grid, for a given layer(s) of an integrated circuit device; defining an initial region of interest for the integrated circuit device; enumerating, according to the initial set of design ground rules, each legal design layout for a given layer of the integrated circuit device in the initial region of interest; running a manufacturing simulation of the enumerated legal design layout data and, responsive to determining one or more failing layouts resulting therefrom, further determining whether the failing layouts may be eliminated by changes in technology parameters and/or updated ground rules. Upon eliminating the one or more failing layouts for the initial region of interest, expanding the initial region of interest and repeating the enumerating, manufacturing simulation, and triage assessment.

17 Claims, 5 Drawing Sheets

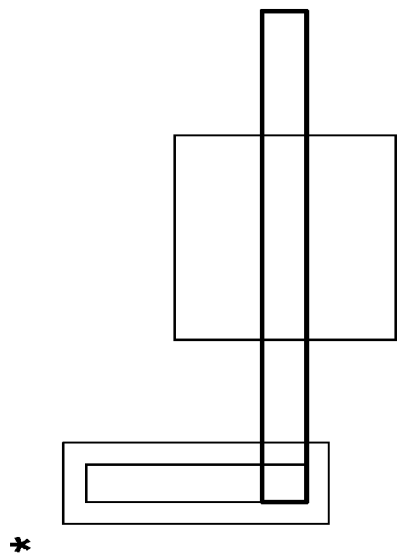
FIG. 3(a)
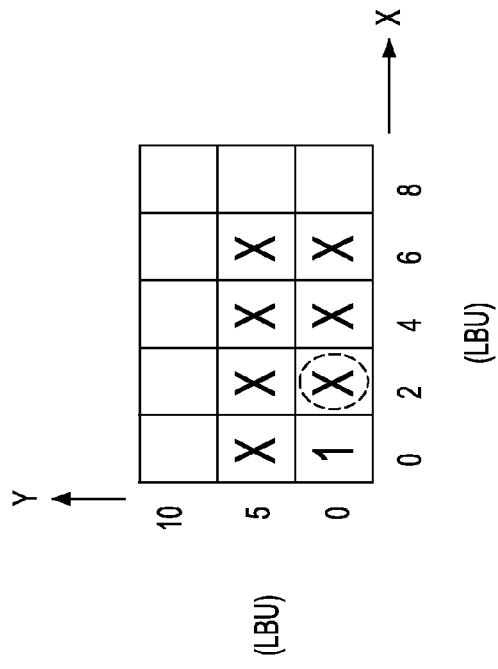
FIG. 3(b)
FIG. 4
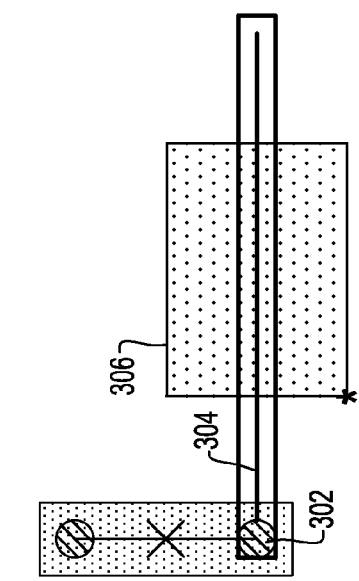
FIG. 3(c)

USING LAYOUT ENUMERATION TO FACILITATE INTEGRATED CIRCUIT DEVELOPMENT

BACKGROUND

The present invention relates generally to integrated circuit device design techniques and, more particularly, to a method and system for using layout enumeration to facilitate integrated circuit development.

In designing an integrated circuit (IC) device, engineers or designers typically rely on computer design tools to help create an IC schematic or design, which can include a multitude of individual devices, such as transistors, coupled together to perform a certain function. To actually fabricate the IC device in or on a semiconductor substrate, the IC device schematic must be translated into a physical representation or layout, which itself can then be transferred onto a semiconductor substrate. Computer aided design (CAD) tools can be used to assist layout designers with translating the discrete circuit elements into shapes, which will embody the devices themselves in the completed IC device. These shapes make up the individual components of the circuit, such as gate electrodes, diffusion regions, metal interconnects and the like.

The software programs employed by the CAD systems to produce layout representations are typically structured to function under a set of predetermined design rules in order to produce a functional circuit. Often, the design rules are determined by certain processing and design limitations based roughly on the patternability of layout designs. For example, design rules may define the space tolerance between devices or interconnect lines. Once the layout of the circuit has been created, the next step in manufacturing the IC device is to transfer the layout onto a semiconductor substrate. Optical lithography or photolithography is a well-known process for transferring geometric shapes onto the surface on a semiconductor wafer. The photolithography process generally begins with the formation of a photoresist layer on the top surface of a semiconductor substrate or wafer. A reticle or mask having certain transmissive regions (e.g., fully light non-transmissive opaque regions such as those formed of chrome, fully light transmissive clear regions such as those formed of quartz, partially transmissive, trilayer, etc.) is then positioned over the photoresist coated wafer.

The mask is placed between a radiation or light source, which can produce light of a pre-selected wavelength (e.g., ultraviolet light) and geometry, and an optical lens system, which may form part of a stepper apparatus. When the light from the light source is directed onto the mask, the light is focused to generate a reduced mask image on the wafer, typically using the optical lens system, which may contain one or several lenses, filters, and/or mirrors. This light passes through the clear regions of the mask to expose the underlying photoresist layer, and is blocked by the opaque regions of the mask, leaving that underlying portion of the photoresist layer unexposed. The exposed photoresist layer is then developed, typically through chemical removal of the exposed or unexposed regions of the photoresist layer. The end result is a semiconductor wafer coated with a photoresist layer exhibiting a desired pattern, which defines the geometries, features, lines and shapes of that layer. This pattern can then be used for etching of or controlling deposition into underlying regions of the wafer.

As indicated above, technology must provide ground rules to designers in order to ensure that designs passing the defined ground rules are in fact manufacturable. Current processes perform simulations and hardware measurements on limited topologies (e.g., typically varying one parameter) to determine allowed edge relations. However, as the size of design features continues to scale below the wavelength of the patterning light source (a situation that is becoming progressively worse), more of the layout needs to be examined to determine whether the design is manufacturable. This leads to at least two negative side effects. First, although design rules are created conservatively with larger margins to try and avoid problem cases, since the rules are not examined beforehand the possibility still exists for surprises, where a design that satisfies design rules is nevertheless non-manufacturable. Secondly, the conservative rules designed to rule out certain failure can often rule out unanticipated but manufacturable and useful layouts as well. Even with these shortcomings, the complexity and number of rules needed to preserve manufacturability has been rapidly growing.

Designer-provided shapes are often manipulated by technology (i.e., retargeted) before mask generation, because the shapes as defined are not manufacturable. However, an acceptable substitute is available. These target shapes are the ones that mask generation will attempt to replicate on the wafer. Using retargeting more generally can provide a means for simplifying the ground rule definition, and provides some flexibility for technology to respond to changes without requiring new design rules. The benefit of Restricted Design Rules is that it reduces the number of possible design layout configurations to allow more extensive computational analysis and optimization.

SUMMARY

A method for using layout enumeration to facilitate integrated circuit development, includes, in an exemplary embodiment, defining an initial set of design ground rules represented in a notation compatible with a coarse placement grid, for the given layer or layers of an integrated circuit device; defining an initial region of interest for the integrated circuit device; enumerating, according to the initial set of design ground rules, each legal design layout for a given layer of the integrated circuit device in the initial region of interest; running a manufacturing simulation of the resulting enumerated legal design layout data and, responsive to determining one or more failing layouts resulting therefrom, further determining whether the one or more failing layouts may be eliminated by changes in technology parameters and/or updated ground rules; and upon eliminating the one or more failing layouts for the initial region of interest, expanding the initial region of interest and repeating the enumerating, manufacturing simulation, and triage assessment operations.

In another embodiment, a computer program product includes a computer readable computer program code for using layout enumeration to facilitate integrated circuit development; and instructions for causing a computer to implement a method, the method further including defining an initial set of design ground rules represented in a notation compatible with a coarse placement grid, for a given layer or layers of an integrated circuit device; defining an initial region of interest for the integrated circuit device; enumerating, according to the initial set of design ground rules, each legal design layout for a given layer of the integrated circuit device in the initial region of interest; running a manufacturing simulation of the resulting enumerated legal design layout data, and responsive to determining one or more failing layouts resulting therefrom, further determining whether the one or more failing layouts may be eliminated by changes in technology parameters and/or updated ground rules; and upon eliminating the one or more failing layouts for the initial region of interest, expanding the initial region of interest and repeating the enumerating, manufacturing simulation, and triage assessment operations.

In still another embodiment, a system for using layout enumeration to facilitate integrated circuit development includes a computing network including a processing device in communication with one or more computer memory storage devices; and the computing network further configured to implement a method, the method further including defining an initial set of design ground rules represented in a notation compatible with a coarse placement grid, for a given layer or layers of an integrated circuit device; defining an initial region of interest for the integrated circuit device; enumerating, according to the initial set of design ground rules, each legal design layout for a given layer of the integrated circuit device in the initial region of interest; running a manufacturing simulation of the resulting enumerated legal design layout data and, responsive to determining one or more failing layouts resulting therefrom, further determining whether the one or more failing layouts may be eliminated by changes in technology parameters and/or updated ground rules; and upon eliminating the one or more failing layouts for the initial region of interest, expanding the initial region of interest and repeating the enumerating, manufacturing simulation, and triage assessment operations.

BRIEF DESCRIPTION OF THE SEVERAL VIEWS OF THE DRAWINGS

Referring to the exemplary drawings wherein like elements are numbered alike in the several Figures:

FIGS. 3(a) and 3(b) illustrate examples of restrictive design rules (RDR) representations of coarse grid layout data, that may be used in accordance with an embodiment of the invention;

FIG. 3(c) is a Boolean representation of coarse grid design data;

FIG. 4 is an exemplary coarse grid layout illustrating a graphical depiction of configuration based ground rules used for pattern enumeration;

DETAILED DESCRIPTION

Disclosed herein is a method and system for using layout enumeration to facilitate integrated circuit development by leveraging the concept of restricted design rules and the growing robustness of manufacturing simulations in order to validate ground rules in a novel manner. Briefly stated, a more complete (and preferably exhaustive) enumeration of all allowed topologies out to an optically significant radius is generated, with the corresponding layout configurations then run through a suitable manufacturing simulation to validate that solutions exist for all supported layouts, to rule out common features of failing layouts, and to drive solutions for important configurations that have high design value.

The process starts with a minimal set of basic placement rules specifying a coarse placement grid and directions for each layer, allowed wire widths, and minimum widths and spaces, all of which may be obtained conventionally. This defines an abstract base of a few patterns. Next, a small region of interest is defined, with a single layer (and optionally some layer above or below) being examined. Because of the coarse grid it is possible to enumerate all allowed layouts on the target layer in this region, and to then run a manufacturability analysis on each. This will initially identify some layouts as non-manufacturable using the current assumptions. Then, a triage step is used to determine whether the manufacturability can be improved by considering other technology options (e.g., different mask generation or lithographic algorithms). If not, the failing layouts can be analyzed to determine what features they have in common in order to construct new forbidden patterns.

The new forbidden pattern rules are then added to a database of patterns and the process is repeated with a larger region (radius) of interest. Progressively pruning the allowed configurations in this manner helps reduce the growth in the number of layouts to consider. In addition, increasing the range also allows new patterns to be discovered. The process may be stopped once the expected radius of optical interactions is reached, which should correspond with no additional new patterns being found.

Figure 1:
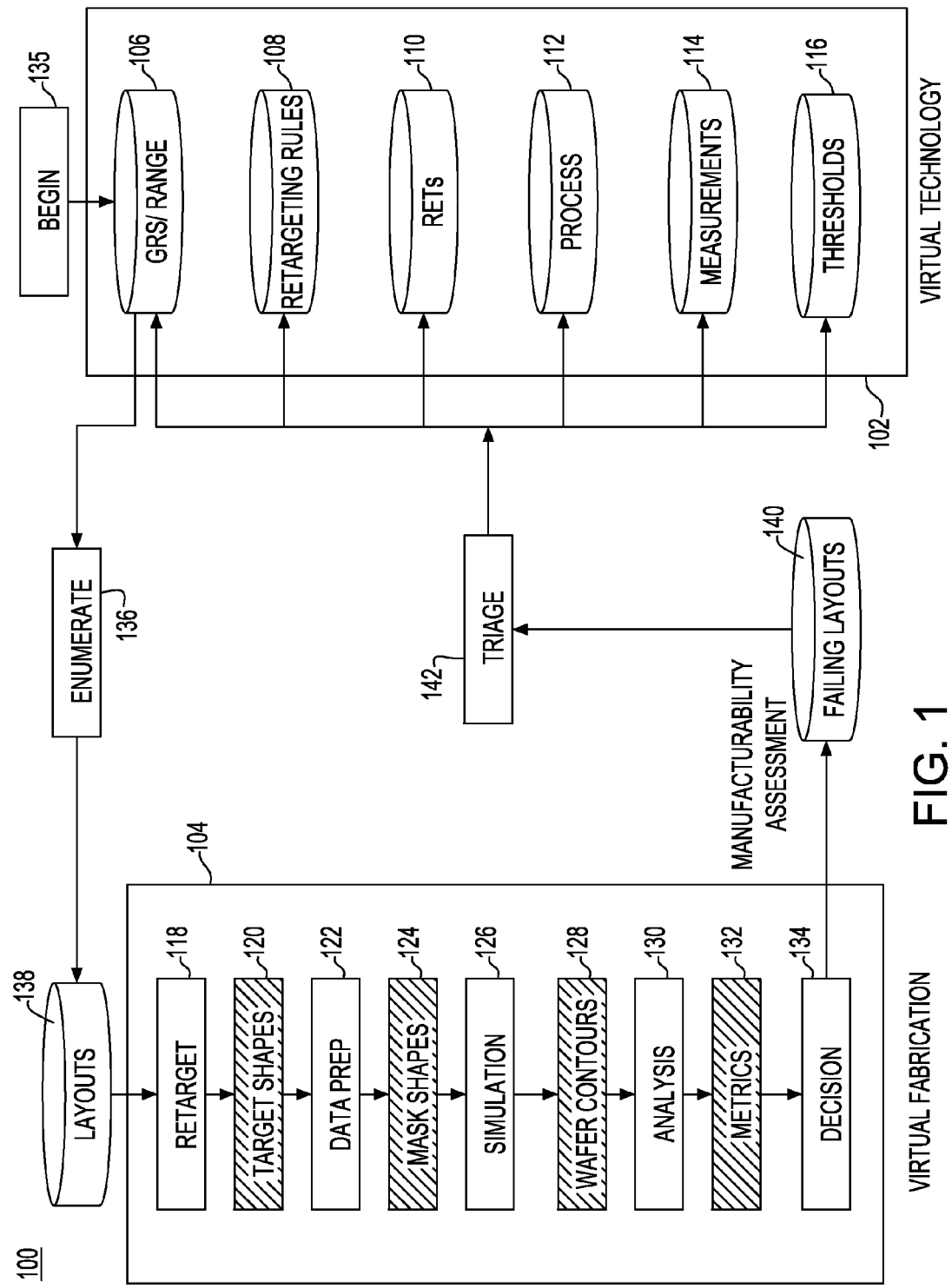
FIG. 1 is a schematic diagram illustrating a high-level optimization process accounting for both virtual fabrication and virtual technology processes, in accordance with an embodiment of the invention.

Referring initially to FIG. 1, there is shown a schematic diagram illustrating a high-level optimization process 100 in which the disclosed layout enumeration technique may be used to converge both virtual fabrication and virtual technology processes, in accordance with an embodiment of the invention. That is, the "rule loop" shown in FIG. 1 represents the optimization process 100 for ground rules and other data that represent the technology. In particular, FIG. 1 illustrates aspects of both virtual technology 102 and virtual fabrication 104. For example, aspects of virtual technology 102 include ground rules data 106, retargeting rules 108, reticle enhancement techniques (RETs) 110, process data 112, measurement data 114 and threshold data 116. However, it should be understood that these are just examples of data that represent integrated circuit technology. Aspects of virtual fabrication are processes and resulting output data (shaded blocks) resulting therefrom such as, for example, retargeting 118/target shapes 120, data prep 122/mask shapes 124, simulation 126/wafer contours 128, analysis 130/metrics 132, and decision 134.

Beginning at block 135 with an initial set of ground rules 106, layout configurations that adhere to those initial rules are generated through a specific enumeration approach (block 136) described in further detail hereinafter. The database of generated layout configurations 138 are then run through the virtual fabrication process 104, which is collectively used as a manufacturability assessment. That is, the particular flow implemented in the virtual fabrication process 104 ultimately determines whether the input layout configurations 138 thereto are in fact manufacturable. Each non-manufacturable configuration, collectively designated by the failing layouts database 140 in FIG. 1 is assessed through a triage process 142 for its "designability" (i.e., its impact on the design by not having it). If a failing layout is considered high impact, then the process 100 focuses on virtual technology 102 in order to attempt to improve the manufacturability by, for example, adjusting retargeting rules 108, RETs 110, or even unit processes 112. Otherwise, the ground rules 106 are updated to exclude the non-manufacturable configurations from designs. The above process is iterated (using increasing size of constructs) until it converges.

Figure 2:
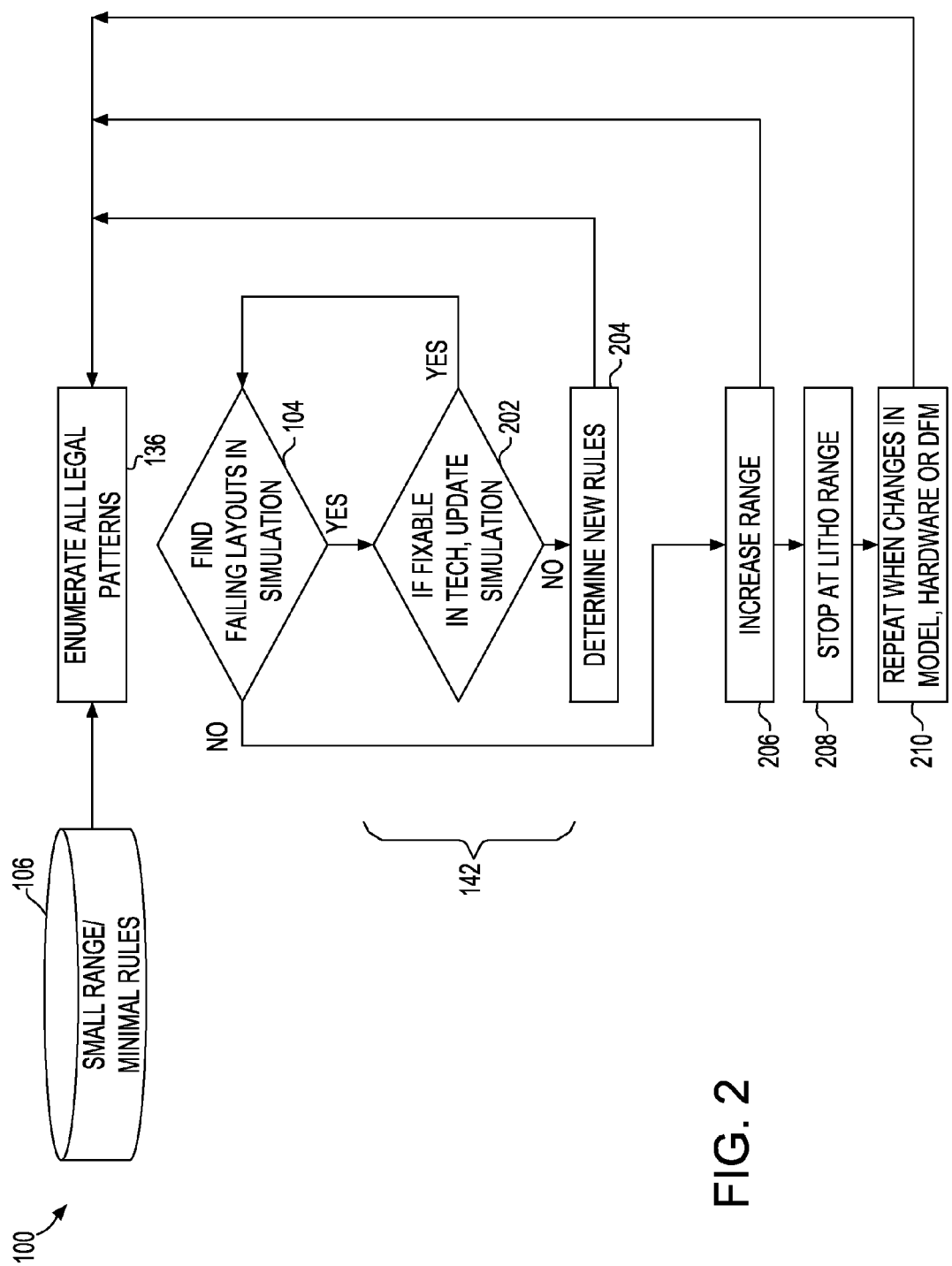
FIG. 2 is flow diagram illustrating a more detailed depiction of the iterative aspect of the process flow of FIG. 1.

FIG. 2 is flow diagram illustrating a more detailed depiction of the iterative aspect of the process flow 100 of FIG. 1, as it pertains to (for a given scope of area on an IC design) attempting to fix, in simulation (virtual technology) failing layouts for the given set of ground rules and, if unsuccessful, determining new rules until all enumerated legal patterns result in manufacturable layouts, and the scope of the range is increased for the next iteration. As shown in FIG. 2, a small range of interest is defined using minimal rules (block 106), after which all legal patterns using the minimal rules and range are enumerated (block 136). Again, additional details concerning enumeration are discussed hereinafter.

Through the virtual fabrication process 104 discussed above, all failing layouts based on the minimal ground rules and range of interest are ascertained. The triage process 142 is then applied to first see if the failing layouts may be fixable in technology. Assuming there are initially failing layouts that may be fixable in technology, the simulation parameters are updated as shown in block 202, and the simulation is rerun (i.e., the process loops back to block 104). However, if the failing layouts are not able to be fixed in technology, then the initially defined simple ground rules are modified in an attempt to weed out failing layouts. That is, new rules are determined at block 204 and the process loops back to the enumeration stage to generate all legal patterns under the new rules at block 136.

Eventually, through the iterative process of modifying technology assumptions and/or determining new ground rules, the failing layouts will be eliminated for that range of interest, so as to advance the method to block 206. At this point, the range of interest of the IC design is expanded, leading to a larger set of enumerated legal patterns back at block 136. The process of determining failing layouts from virtual fabrication, changing technology and/or defining new ground rules is repeated until failing layouts for the expanded range has also been eliminated. Once again, the range of interest is expanded, and the process is further repeated.

As shown in block 208, the process of range expansion may terminate upon reaching a range corresponding to, for example, the range of the present lithography capabilities. This may provide a complete set of rules that result in manufacturable layouts. On the other hand, if the lithography range results in an unacceptably large number of pattern enumerations, layout simulations and rules updating iterations, then the process can at some point be converted to a random enumeration of legal patterns instead of an exhaustive enumeration at each progressively larger range. Finally, at block 210, the process may be restarted in response to "real world" changes in modeling, hardware or design for manufacturability (DFM) techniques.

In the present embodiments, the basis of enumeration efficiency lies in the representation of shapes data in a Boolean format that, in particular, represents the presence or absence of features (e.g., typically centers or centerlines). Different layers may have different interpretations of these Booleans as shapes. Further, it is very effective to use a Boolean representation of coarse gridded design data, in order to provide simple pattern-based representation, minimize checking overhead, as well as to provide a simple translation to any preferred design representation.

FIGS. 3(a) and 3(b) illustrate examples of restrictive design rules (RDR) representations of coarse grid layout data, that may be used in the above described enumeration. For example, FIG. 3(a) depicts a grid and glyph representation of a layout format developed by IBM Corporation and referred to as "L3GO." The L3GO layout typically includes three primary geometric types of primitives or glyphs: point glyphs 302 (0-dimensional), stick glyphs 304 (1-dimensional), and rectangle glyphs 306 (2-dimensional). The grid is a rectangular array of points, all of which are subsets of a built-in manufacturing grid. Each glyph is specified with respect to the grid and assigned to a layer. Additional information concerning coarse grid, L3GO design layout may be found in U.S. Patent Application Publication 2006/0036977, assigned to the assignee of the present application, the contents of which are incorporated herein in their entirety.

Similarly, FIG. 3(b) depicts a lambda grid representation of a layout format, such as used by the open source Magic VLSI layout tool developed at Berkeley in the 1980's. Regardless of the specific RDR representation used, the coarse grid layout may be represented in a Boolean format, such as shown in the example of FIG. 3(c). Thus, the 1's in FIG. 3(c) may represent the presence of a feature such as a metal line, while the 0's in FIG. 3(c) may represent the absence of such features.

Enumeration efficiency may be realized through a simple, pattern-based representation of forbidden rules. Although it is sometimes necessary to code multiple such rules for a single simple spacing rule, the overall efficiency enables checking of all rules to occur in the inner loop of a large recursion (e.g., as shown in blocks 136, 104, 202 and 204 of FIG. 2) where all possible bits are tried, although branches are pruned once enough bits are present to match a failing pattern.

In an exemplary embodiment, the Boolean representation of design rules is implemented by a definition of forbidden patterns, as specified by bit patterns. Although simple width space checks may require multiple Boolean patterns, more complex pattern-based checks (problematic to code in traditional frameworks) use the same checking code. As used herein, a configuration-based set of rules for enumeration is defined, wherein a configuration refers to a set of parameters the specify the occupancy (or not) of a forbidden layout, and which may be represented by the following notation:

(level, x, y, value)

wherein "level" refers to a specific layer of an integrated circuit device (e.g., contact area, M1, M2, etc.); "x" and "y" refer to specific coarse grid coordinates on the level indicated, and "value" refers to the Boolean value of whether the grid coordinate is occupied or not. "Level" may also refer to a subset of a specific layer, for example, M1 of a specific width or orientation, or CA of a particular redundancy. By way of a simple example, and with reference to FIG. 4, it is assumed that a design rule for the contact area (CA) level coarse grid of 2 LBU (layout basic units) in the x-direction and 5 LBU in the y-direction is a minimum feature space of 8 LBU. Thus, one example (in the above styled configuration notation) of a forbidden layout is as follows:

(CA, 0, 0, 1)—the lower left corner of the grid is occupied; AND (CA, 2, 0, 1)—the next grid space over in the x-direction cannot also be occupied.

In other words, if location (x, y)=(0, 0) is occupied by a feature, as indicated by the "1" in the lower left grid space in FIG. 4, then in order to satisfy the rule of a minimum space of 8 LBU, then there cannot be any features present in the boxes indicated with an "X" in FIG. 4. The "X" that is indicated in the dashed circle in FIG. 4 corresponds to grid (x, y) position (2, 0). Thus, the condition (CA, 2, 0, 1) as denoted above represents a forbidden layout condition with respect to (CA, 0, 0, 1). Accordingly, as shown in FIG. 4, each location corresponding to an "X" represents a specific forbidden condition with respect to (CA, 0, 0, 1).

By way of another example, using multiple layers for the design rule that a contact area (CA) must be directly below an M1 metal line, a forbidden layout condition would be:

(CA, 0, 0, 1)—the lower left corner of the CA grid is occupied; AND (M1, 0, 0, 0)—the lower left corner of the M1 is NOT occupied.

Represented in this fashion, the forbidden definitions can be used to prune away invalid bit positions, thereby leaving all legal patterns enumerated for subsequent simulation in virtual fabrication. It will be appreciated that different recursion schemes and techniques are possible to improve pruning. For example, the preprocessing of forbidden patterns can be used in order to improve checking speed. In addition, seeded enumeration is possible for exploring particular layouts of interest, in order to enumerate various contexts. Boundary conditions may also be used to enumerate a smaller number of standalone layouts (e.g., exterior=empty), or templates for later assembly (e.g., exterior=unknown). Random enumeration is also possible, as stated above, when ranges are too significant to be exhaustively listed. It is further contemplated that the output (and checking) may be filtered by translational and reflection symmetries techniques in order to reduce output data volume. Moreover, the output may be tailored for various uses (e.g., Cadence Skill for visualization & conventional checking, GL1/Oasis for lithography simulation, bit vectors for pattern-finding, etc.).

Figure 5:
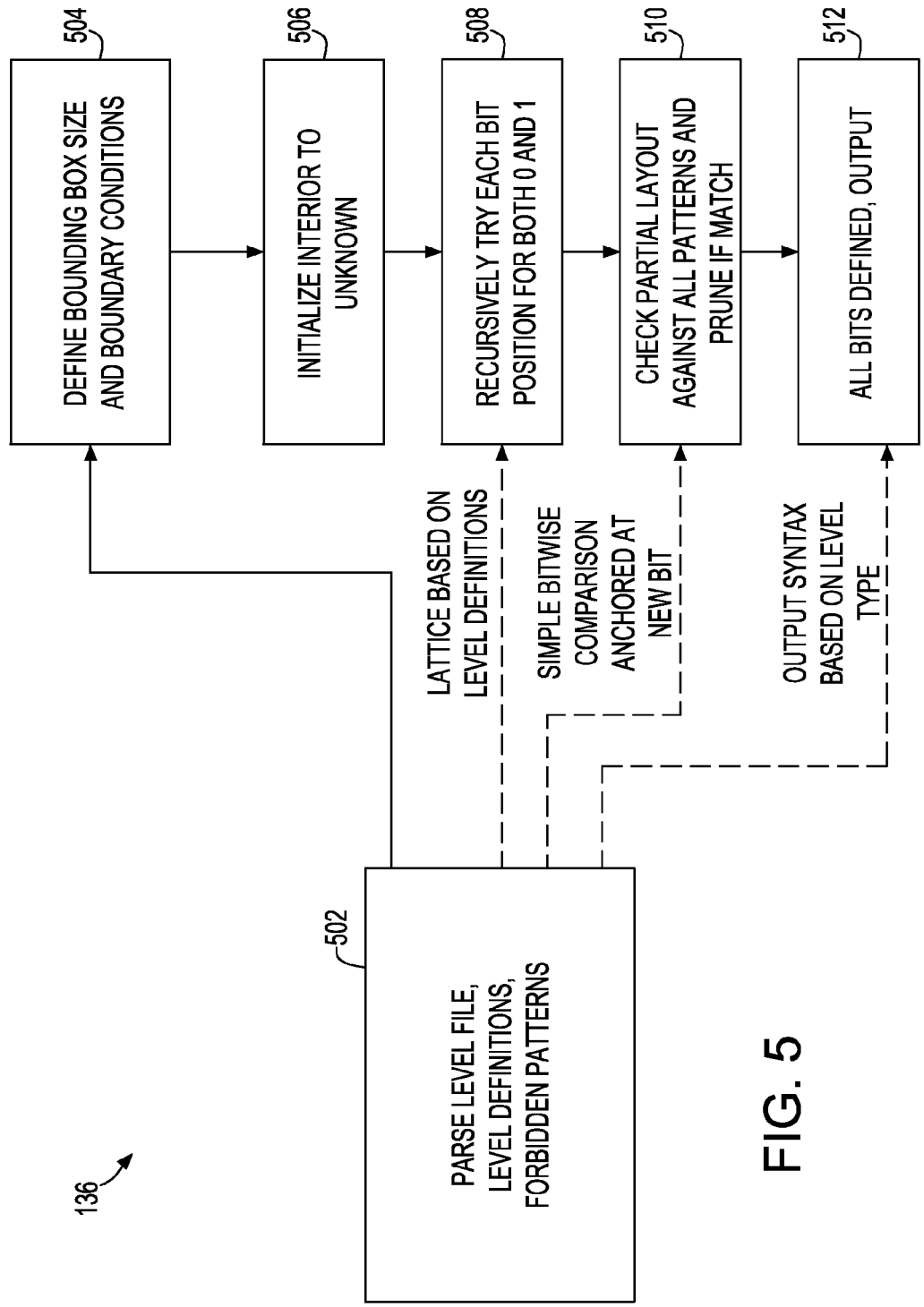
FIG. 5 is a flow diagram that summarizes the enumeration process, generally described in conjunction with FIGS. 1 and 2, in accordance with a further embodiment of the invention

FIG. 5 is a flow diagram that summarizes the enumeration process 136, generally described in conjunction with FIGS. 1 and 2, in accordance with a further embodiment of the invention. As shown in block 502, enumeration begins through an input process of parsing a file containing level definitions and forbidden patterns according to the currently defined ground rules. In block 504, the bounding box size (e.g., as shown in FIG. 4), and boundary conditions are established for the coarse grids used for design data representation. The bounding box sizes may start out relatively small, and bounding conditions may be represented for example, by setting the value of every grid space beyond the bounding box as a "0" bit. This would represent an example of exterior=empty for standalone layouts as describe above. Alternatively, the exterior grid spaces can be defined as unknown.

In block 506, the interior grid points of the bounding box are initialized to "unknown", followed by recursively trying each bit position in the bounding box for both "0" and "1" conditions in block 508. As also reflected in FIG. 5, the lattice (grid) for a given level is based on the level definition itself. Through a simple bitwise comparison (anchored at a new bit) shown in block 510, the partial layout resulting from each recursive bit combination is checked against all forbidden ground rule patterns represented in the above described format. Those layouts that match the forbidden patterns are pruned out as being illegal layouts. Once all comparisons are complete, the bits representing the valid layout patterns are output for simulation, as shown in block 512 wherein the output syntax may be based on level type and the desired downstream application (such as, for example, viewing, simulation, or further analysis).

Figure 6:
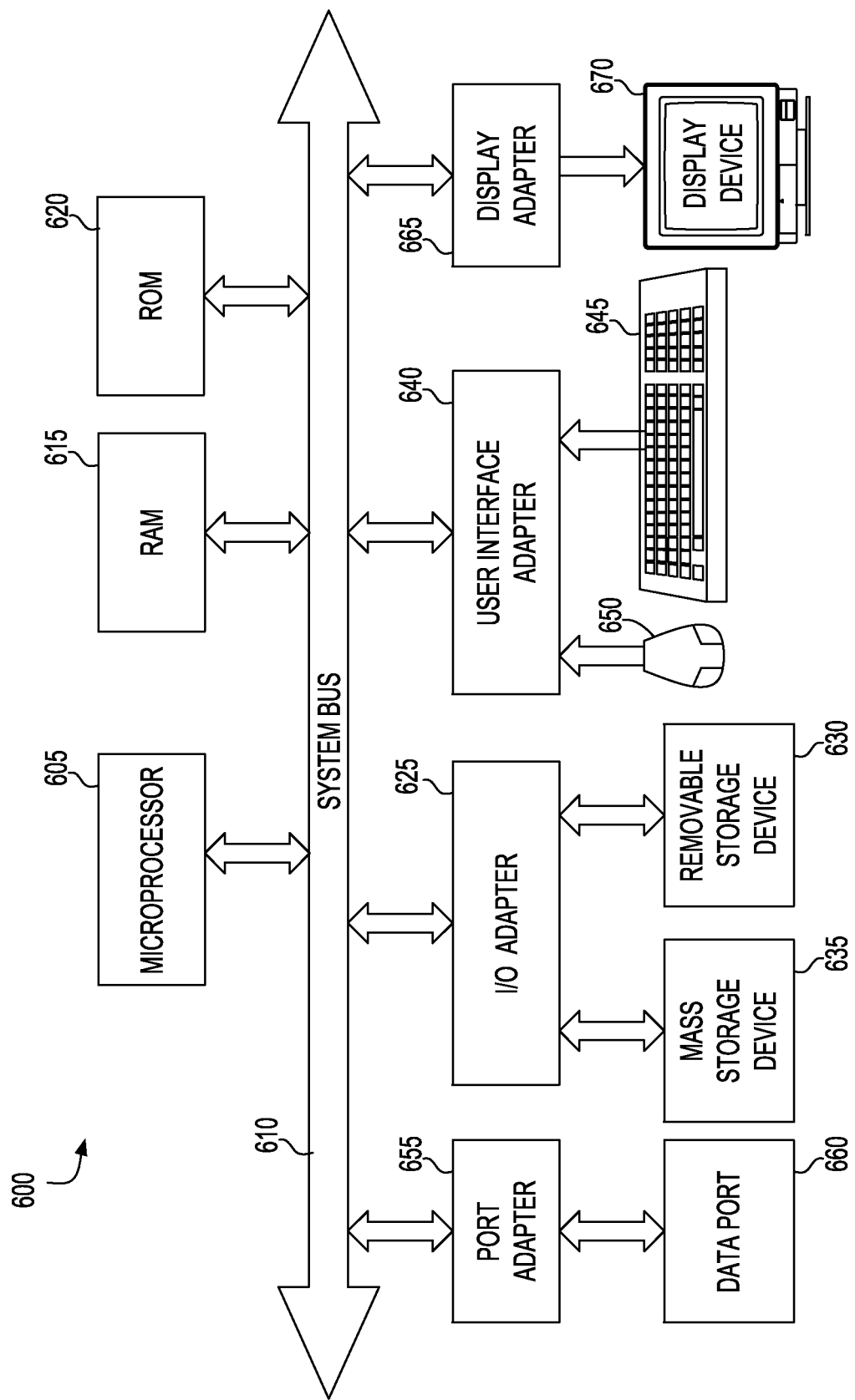
FIG. 6 is a schematic block diagram of a general-purpose computing system suitable for practicing embodiments of the present invention.

Generally, the method embodiments for using layout enumeration to facilitate integrated circuit development may be practiced with a general-purpose computer and the method may be coded as a set of instructions on removable or hard media for use by the general-purpose computer. FIG. 6 is a schematic block diagram of a general-purpose computing system suitable for practicing embodiments of the present invention. In FIG. 6, computing system 600 has at least one microprocessor or central processing unit (CPU) 605. CPU 605 is interconnected via a system bus 610 to a random access memory (RAM) 615, a read-only memory (ROM) 620, an input/output (I/O) adapter 625 for a connecting a removable data and/or program storage device 630 and a mass data and/or program storage device 635, a user interface adapter 640 for connecting a keyboard 645 and a mouse 650, a port adapter 655 for connecting a data port 660 and a display adapter 665 for connecting a display device 670.

ROM 620 contains the basic operating system for computing system 600. The operating system may alternatively reside in RAM 615 or elsewhere as is known in the art. Examples of removable data and/or program storage device 630 include magnetic media such as floppy drives and tape drives and optical media such as CD ROM drives. Examples of mass data and/or program storage device 635 include hard disk drives and non-volatile memory such as flash memory. In addition to keyboard 645 and mouse 650, other user input devices such as trackballs, writing tablets, pressure pads, microphones, light pens and position-sensing screen displays may be connected to user interface 640. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 630, fed through data port 660 or typed in using keyboard 645.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIGS. 1, 2 and 5.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for using layout enumeration to facilitate integrated circuit development, the method comprising:
   defining an initial set of design ground rules represented in a notation compatible with a coarse placement grid, for a given layer or layers of an integrated circuit device;
   defining an initial region of interest for the integrated circuit device;
   enumerating by generating, according to the initial set of design ground rules, only all possible legal design layouts allowed by the initial set of design ground rules for a given layer of the integrated circuit device in the initial region of interest;
   running, using a computer, a manufacturing simulation of the resulting enumerated legal design layout data and, responsive to determining one or more failing layouts resulting therefrom, performing a triage assessment by further determining whether the one or more failing layouts are removable by changes in technology parameters and/or updated ground rules; and
   upon eliminating the one or more failing layouts for the initial region of interest, expanding the initial region of interest and repeating the enumerating, manufacturing simulation, and triage assessment operations.

2. The method of claim 1, wherein the triage assessment further comprises:
   changing one or more virtual technology parameters and rerunning the manufacturing simulation on the one or more failing layouts; and
   determining updated ground rules targeted toward eliminating any of the one or more failing layouts not eliminated by the triage assessment and rerunning the manufacturing simulation, enumerating each legal design layout based on the updated ground rules, and running a manufacturing simulation of the updated enumerated legal design layout data, until simulated failing layouts for the initial region of interest are eliminated.

3. The method of claim 2, wherein the one or more virtual technology parameters include one or more of retargeting rules, reticle enhancement techniques (RETs), process data, measurement data, and threshold data.

4. The method of claim 2, wherein the enumeration of a legal layout design further comprises:
   receiving input data comprising ground rule based, forbidden layout configurations that are in a Boolean representation, the Boolean representation comprising, for a given device layer and grid position, whether the grid position is occupied by a feature or not;
   generating, in accordance with a current range of interest, possible layout configurations for the coarse placement grid; and
   comparing each of generated possible layout configurations with the forbidden layout configurations, and eliminating any of the generated possible layout configurations that match any of the forbidden layout configurations, wherein the remaining generated possible layout configurations that do not match any of the forbidden layout configurations comprise the enumerated legal design layouts subject to subsequent manufacturing simulations thereof.

5. The method of claim 4, wherein the comparing each generated possible layout configurations with the forbidden layout configurations further comprises a recursive, bitwise comparison of bit patterns of the generated possible layout configurations and the forbidden layout configurations.

6. The method of claim 1, further comprising expanding the initial region of interest and repeating the enumerating, manufacturing simulation, and triage assessment operations until the region of interest corresponds to a defined lithography patterning capability.

7. A computer program product, comprising:
   a non-transitory computer readable medium having computer readable computer program code stored thereon that, when executed by a computer, implements a method for using layout enumeration to facilitate integrated circuit development, the method further comprising:
   defining an initial set of design ground rules represented in a notation compatible with a coarse placement grid, for a given layer or layers of an integrated circuit device;
   defining an initial region of interest for the integrated circuit device;
   enumerating by generating, according to the initial set of design ground rules, only all possible legal design layouts allowed by the initial set of design ground rules for a given layer of the integrated circuit device in the initial region of interest;
   running a manufacturing simulation of the resulting enumerated legal design layout data, and responsive to determining one or more failing layouts resulting therefrom, performing a triage assessment by further determining whether the one or more failing layouts are removable by changes in technology parameters and/or updated ground rules; and
   upon eliminating the one or more failing layouts for the initial region of interest, expanding the initial region of interest and repeating the enumerating, manufacturing simulation, and triage assessment operations.

8. The computer program product of claim 7, wherein the triage assessment further comprises:
   changing one or more virtual technology parameters and rerunning the manufacturing simulation on the one or more failing layouts; and
   determining updated ground rules targeted toward eliminating any of the one or more failing layouts not eliminated by the triage assessment and rerunning the manufacturing simulation, enumerating each legal design layout based on the updated ground rules, and running a manufacturing simulation of the updated enumerated legal design layout data, until simulated failing layouts for the initial region of interest are eliminated.

9. The computer program product of claim 8, wherein the one or more virtual technology parameters include one or more of retargeting rules, reticle enhancement techniques (RETs), process data, measurement data, and threshold data.

10. The computer program product of claim 8, wherein the enumeration of a legal layout design further comprises:
    receiving input data comprising ground rule based, forbidden layout configurations that are in a Boolean representation, the Boolean representation comprising, for a given device layer and grid position, whether the grid position is occupied by a feature or not;
    generating, in accordance with a current range of interest, possible layout configurations for the coarse placement grid; and
    comparing each of generated possible layout configurations with the forbidden layout configurations, and eliminating any of the generated possible layout configurations that match any of the forbidden layout configurations, wherein the remaining generated possible layout configurations that do not match any of the forbidden layout configurations comprise the enumerated legal design layouts subject to subsequent manufacturing simulations thereof.

11. The computer program product of claim 10, wherein the comparing each generated possible layout configurations with the forbidden layout configurations further comprises a recursive, bitwise comparison of bit patterns of the generated possible layout configurations and the forbidden layout configurations.

12. The computer program product of claim 7, wherein the method further comprises expanding the initial region of interest and repeating the enumerating, manufacturing simulation, and triage assessment operations until the region of interest corresponds to a defined lithography patterning capability.

13. A system for using layout enumeration to facilitate integrated circuit development, comprising:
 a computing network including a processing device in communication with one or more computer memory storage devices; and
 the computing network further configured to implement a method, the method further comprising:
  defining an initial set of design ground rules represented in a notation compatible with a coarse placement grid, for a given layer or layers of an integrated circuit device;
  defining an initial region of interest for the integrated circuit device;
  enumerating by generating, according to the initial set of design ground rules, only all possible legal design layouts allowed by the initial set of design ground rules for a given layer of the integrated circuit device in the initial region of interest;
  running a manufacturing simulation of the resulting enumerated legal design layout data and, responsive to determining one or more failing layouts resulting therefrom, performing a triage assessment by further determining whether the one or more failing layouts are removable by changes in technology parameters and/or updated ground rules; and
  upon eliminating the one or more failing layouts for the initial region of interest, expanding the initial region of interest and repeating the enumerating, manufacturing simulation, and triage assessment operations.

14. The system of claim 13, wherein the triage assessment further comprises:
 changing one or more virtual technology parameters and rerunning the manufacturing simulation on the one or more failing layouts; and
 determining updated ground rules targeted toward eliminating any of the one or more failing layouts not eliminated by the triage assessment and rerunning the manufacturing simulation, enumerating each legal design layout based on the updated ground rules, and running a manufacturing simulation of the updated enumerated legal design layout data, until simulated failing layouts for the initial region of interest are eliminated.

15. The system of claim 14, wherein the one or more virtual technology parameters include one or more of retargeting rules, reticle enhancement techniques (RETs), process data, measurement data, and threshold data.

16. The system of claim 14, wherein the enumeration of a legal layout design further comprises:
 receiving input data comprising ground rule based, forbidden layout configurations that are in a Boolean representation, the Boolean representation comprising, for a given device layer and grid position, whether the grid position is occupied by a feature or not;
 generating, in accordance with a current range of interest, possible layout configurations for the coarse placement grid; and
 comparing each of generated possible layout configurations with the forbidden layout configurations, and eliminating any of the generated possible layout configurations that match any of the forbidden layout configurations, wherein the remaining generated possible layout configurations that do not match any of the forbidden layout configurations comprise the enumerated legal design layouts subject to subsequent manufacturing simulations thereof.

17. The system of claim 16, wherein the comparing each generated possible layout configurations with the forbidden layout configurations further comprises a recursive, bitwise comparison of bit patterns of the generated possible layout configurations and the forbidden layout configurations.

* * * * *